United States Patent [19]

Hecht

[11] Patent Number: 6,125,059
[45] Date of Patent: Sep. 26, 2000

[54] METHOD FOR ERASING NONVOLATILE MEMORY CELLS IN A FIELD PROGRAMMABLE GATE ARRAY

[75] Inventor: Volker Hecht, Los Altos, Calif.

[73] Assignee: GateField Corporation, Fremont, Calif.

[21] Appl. No.: 09/311,975

[22] Filed: May 14, 1999

[51] Int. Cl.[7] .................................................. G11C 16/00
[52] U.S. Cl. .............................. 365/185.29; 365/185.18; 326/39
[58] Field of Search ..................... 365/185.18, 185.29; 326/39, 37, 38

[56] References Cited

U.S. PATENT DOCUMENTS

| | | | |
|---|---|---|---|
| 5,615,150 | 3/1997 | Lin et al. .......................... | 365/185.29 |
| 5,914,904 | 6/1999 | Sansbury ............................. | 365/185.29 |
| 5,969,992 | 10/1999 | Mehta et al. ....................... | 365/185.29 |
| 5,999,449 | 12/1999 | Mehta et al. ....................... | 365/185.29 |

*Primary Examiner*—Tan T. Nguyen
*Attorney, Agent, or Firm*—Townsend and Townsend and Crew LLP

[57] ABSTRACT

In an FPGA, nonvolatile reprogrammable interconnect cells which have a switch transistor and at least one second transistor for programming and sensing, or a second transistor for sensing and a buried N+ region for programming the cell, use a high voltage on the common control gate for the cell erasing operation. The source/drains of the switch transistor are grounded. By placing an intermediate voltage on the source/drains of the second transistor, erase times can be reduced and test costs can be significantly lowered.

5 Claims, 8 Drawing Sheets

Topological Layout of new FPGA cell

Schematic of 4 row by 2 column array of new FPGA cells

METHOD FOR ERASING NONVOLATILE MEMORY CELLS IN A FIELD PROGRAMMABLE GATE ARRAY

BACKGROUND OF THE INVENTION

The present invention is related to Field Programmable Gate Array integrated circuits (FPGAs) and, in particular, to FPGAs having nonvolatile memory cells as the programming portion of the programmable interconnect.

The present invention is related to field programmable integrated circuits, especially Field Programmable Gate Arrays (FPGAs), and more particularly, to floating gate MOS transistors used as switching elements in an FPGA. Typically, an FPGA has an array of logic elements and wiring interconnections with many thousands of programmable interconnects so that the FPGA can be configured by the user into an integrated circuit with defined functions. Each programmable interconnect, or switch, can connect two circuit nodes in the integrated circuit to make (or break) a wiring interconnection or to set the function or functions of a logic element.

FPGAs use either memory cells or antifuses for the programmable interconnect. Memory cells are reprogrammable and antifuses are programmable only once. One type of memory-cell programmable interconnect is disclosed in U.S. Pat. No. 5,764,096, entitled, "A GENERAL PURPOSE, NON-VOLATILE REPROGRAMMABLE SWITCH," which issued Jun. 9, 1998 by Robert J. Lipp et al. and is assigned to the present assignee. In the FPGA described in the patent, a non-volatile reprogrammable transistor memory (NVM) cell provides a switching function to randomly interconnect FPGA wiring and circuit elements. Basically, an NVM cell has an MOS transistor with a floating gate which may be charged and/or discharged to provide for the non-volatile programmability feature of NVM technologies.

Further improvements and variations of this programmable interconnect are disclosed in U.S. Pat. No. 5,838,040, entitled, "NONVOLATILE REPROGRAMMABLE INTERCONNECT CELL WITH FN TUNNELING IN SENSE," which issued on Nov. 17, 1998 to R. M. Salter, III, et al. and is assigned to the present assignee; and U.S. application. Ser. No. 09/205,876, entitled "IMPROVED NONVOLATILE REPROGRAMMABLE INTERCONNECT CELL WITH PROGRAMMABLE BURIED BITLINE," filed Dec. 4, 1998 by Jack Zezhong Peng et al. and is assigned to the present assignee (Attorney's Docket No. 16333-16). Still other improvements are described in U.S. application. Ser. No. 09/205,678, entitled "NONVOLATILE REPROGRAMMABLE INTERCONNECT CELL WITH PROGRAMMABLE BURIED SOURCE/DRAIN IN SENSE TRANSISTOR," filed Dec. 4, 1998 by Jack Zezhong Peng et al. and is assigned to the present assignee (Attorney's Docket No. 16333-17). The patent and applications are hereby incorporated by reference.

However, the erasing and programming operations of these programmable interconnects still require high voltages (approximately 20 volts) for relatively long periods of time in comparison to the switching times of the FPGA in normal operation. High voltages place stringent requirements on the programming circuits and the high voltages require more valuable area on the integrated circuit substrate than do low voltages. The erase times are directly related to the costs of testing the FPGA. The present invention is directed toward the lowering of voltages and/or times in the erasing operation, which is typically performed on all of the programmable interconnects before programming of selected interconnects is performed.

SUMMARY OF THE INVENTION

The present invention provides for method of erasing programmable interconnect cells which selectively interconnect circuit nodes in an integrated circuit. Each programmable interconnect cell has a first transistor having a floating gate, a control gate, and first and second source/drain regions which connected respectively to the circuit nodes. The programmable interconnect cell also has a second transistor having a floating gate connected to the floating gate of the first transistor, a control gate connected to the control gate of the first transistor, and first and second source/drain regions. The method of erasing the programmable interconnect cells comprises asserting a first voltage of a first polarity on the control gates of the first and second transistors; asserting a ground voltage on the first and second source/drain regions of the first transistor; and asserting a second voltage intermediate the first voltage and the ground voltage on the first and second source/drain regions of the second transistor.

The programmable interconnect cells may have a further tunneling device with a floating gate connected to the floating gates of the first and second transistors, a control gate connected to the control gates of the first and second transistors, and a conductive region below the floating and the control gate. The method of erasing these programmable interconnect cells further comprises asserting a third voltage intermediate the first voltage and the ground voltage on the conductive region of the tunneling device.

DESCRIPTION OF THE SPECIFIC EMBODIMENTS

The present invention is applicable to the two general types of programmable interconnects of which the above-mentioned U.S. Pat. No. 5,838,040 and U.S. application. Ser. No. 09/205,678 describe examples of one type and U.S. application. Ser. No. 09/205,876 describes examples of the second type. All of the programmable interconnects have a switch MOS transistor which has its two source/drains connected to first and second circuit nodes respectively of the user-configurable circuit of the FPGA. The switch transistor also has a floating gate for turning the transistor off and on responsive to the amount of charge on the floating gate. To erase and program the floating gate of the switch transistor, a connected sense MOS transistor or an additional erase/programming device is used. In any case, the sense transistor has its floating gate tightly coupled to the floating gate of the switch transistor and a control gate, which is capacitively coupled to the floating gate. The sense transistor also has source/drain regions which are connected to control lines which, with the control gate, are used to sense the state of the floating gate of the switch transistor after programming.

Figure 1:
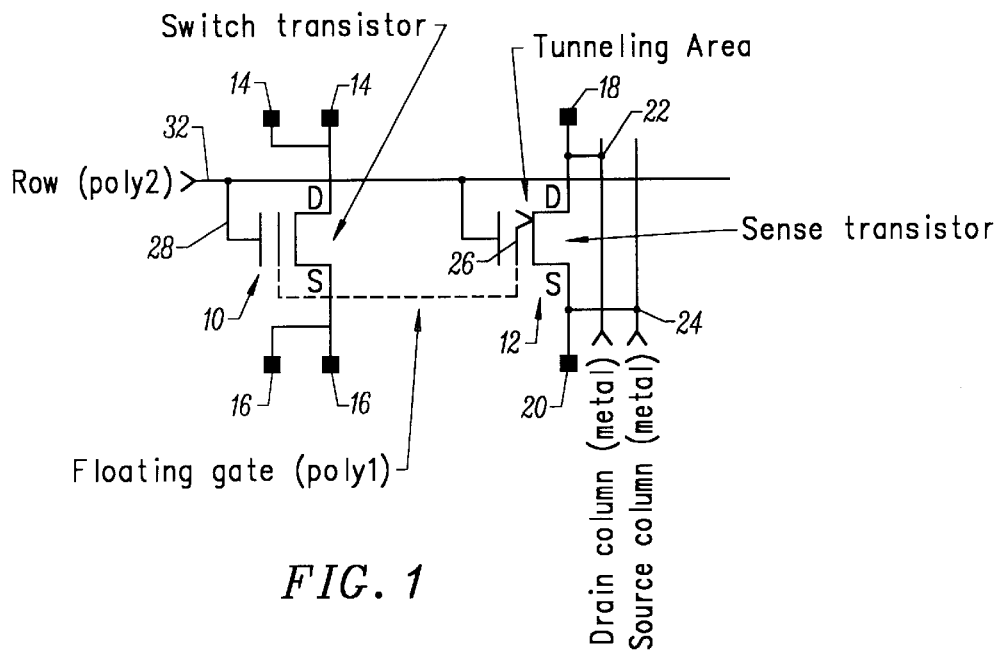
FIG. 1 is a schematic of one type of FPGA programmable interconnect cell in which the present invention may be applied.

In the first type of programmable interconnect, the sense transistor also has a tunneling region for erasing and programming its floating gate and that of its connected switch transistor. The above-mentioned U.S. Pat. No. 5,838,040 describes examples of this type of programmable interconnect, of which FIG. 1 is a schematic of the programmable interconnect cell. The FPGA cell includes a switch transistor 10 and a Fowler-Nordheim tunneling device and sense transistor 12. The switch transistor 10 has contacts 14 and 16 connected respectively to the drain and source regions of the transistor, and the sense transistor 12 has contacts 18 and 20 connected respectively to the drain and source regions of the transistor. The drain of the sense transistor 12 is connected also to a drain column (metal) line 22, and the source is connected to a source column (metal) line 24. Column lines 22, 24 are connected to all source and drain regions of sense transistors 12 in one column. The switch transistor 10 and sense transistor 12 share a common floating gate 26 with the floating gate being positioned between control gate 28 of the switch transistor 10 and the control gate 30 of the sense transistor 12. The control gates are connected to a row (poly 2) line 32.

Figure 2:
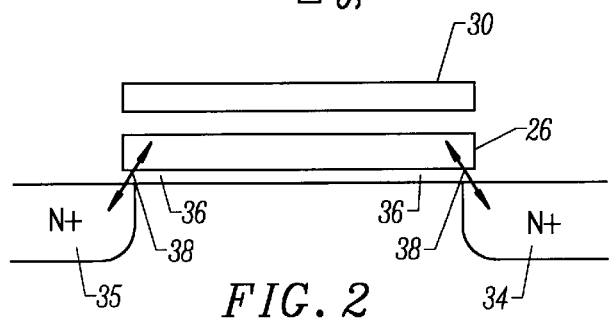
FIG. 2 is a section view of the sense transistor of FIG. 1.

As illustrated more clearly in the section view of the sense transistor 12 in FIG. 2, the floating gate 26 in the sense transistor is positioned in close abutment or overlap of the N+ doped drain 34 and/or source 35 of the sense transistor with tunneling oxide 36 having a thickness on the order of 80Å to 120Å separating the floating gate 26 and the N+ drain 34 to facilitate the tunneling of electrons between the floating gate and drain regions as indicated by the arrow 38. Thus erase of the FPGA programmable interconnect cell occurs by electron tunneling to the floating gate from the drain source and channel regions. Programming of the FPGA cell occurs by electron tunneling from the floating gate to the drain and/or the source of the sense transistor only.

Figure 3:
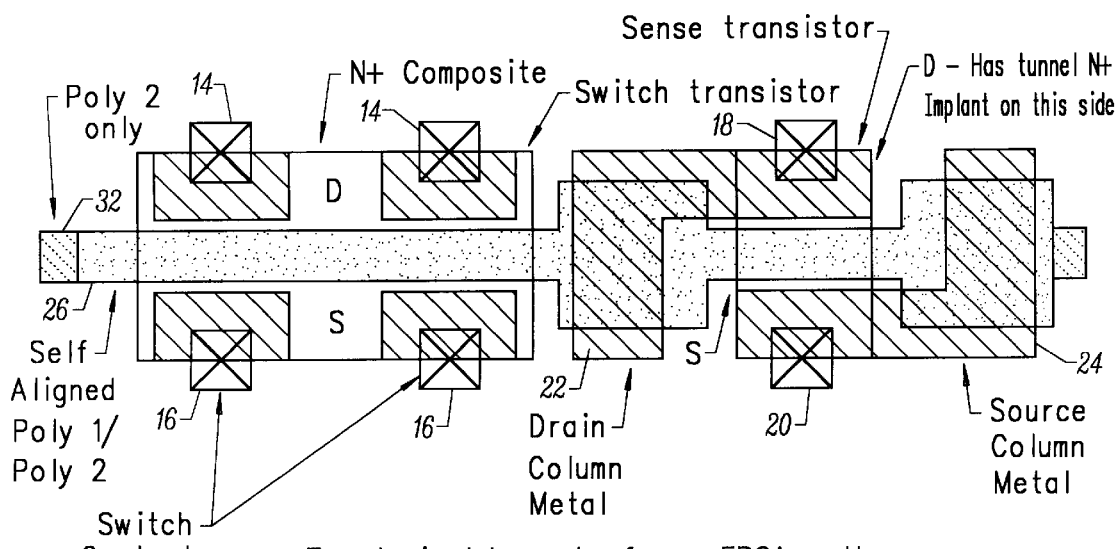
FIG. 3 is a plan view illustrating the layout of the FPGA cell of FIG. 1.

FIG. 3 is a plan view of the layout of the FPGA programmable interconnect cell of FIG. 1. The switch transistor 10 and sense transistor 12 are in spaced horizontal alignment in a semiconductor wafer with floating gate 26 comprising a first polysilicon line (poly 1) overlying the channel region between the source and drain of transistor 10 and the source and drain of sense transistor 12. The poly 1 line terminates on either side of the cell and does not continue to adjacent cells. The control gates 28, 30 of the two transistors is provided by a second polysilicon line (poly 2) 32 which extends over the poly 1 line and is self-aligned therewith. The poly 2 line continues to all transistors in cells arranged in a row. The drain column line 22 is connected to the contact 18 to the drain and continues vertically to contact the drain terminals of all sense transistors in a column. Similarly, the source column metal line 24 engages source contact 20 and extends vertically to contact all source regions of sense transistors in the column. Thus, in a column of FPGA cells, all sense transistor sources are connected to one column line, referred to as a source column, and all drains are connected to a second column line referred to as a drain column. The cell illustrated in FIG. 3 contains half of a shared source contact and half of a shared drain contact for adjacent sense devices, which also perform program and erase functions. As noted above, the sense device is required to test the programmed or erased state of each FPGA cell since the switch transistors are wired into the FPGA array and are not accessible.

Figure 4A:
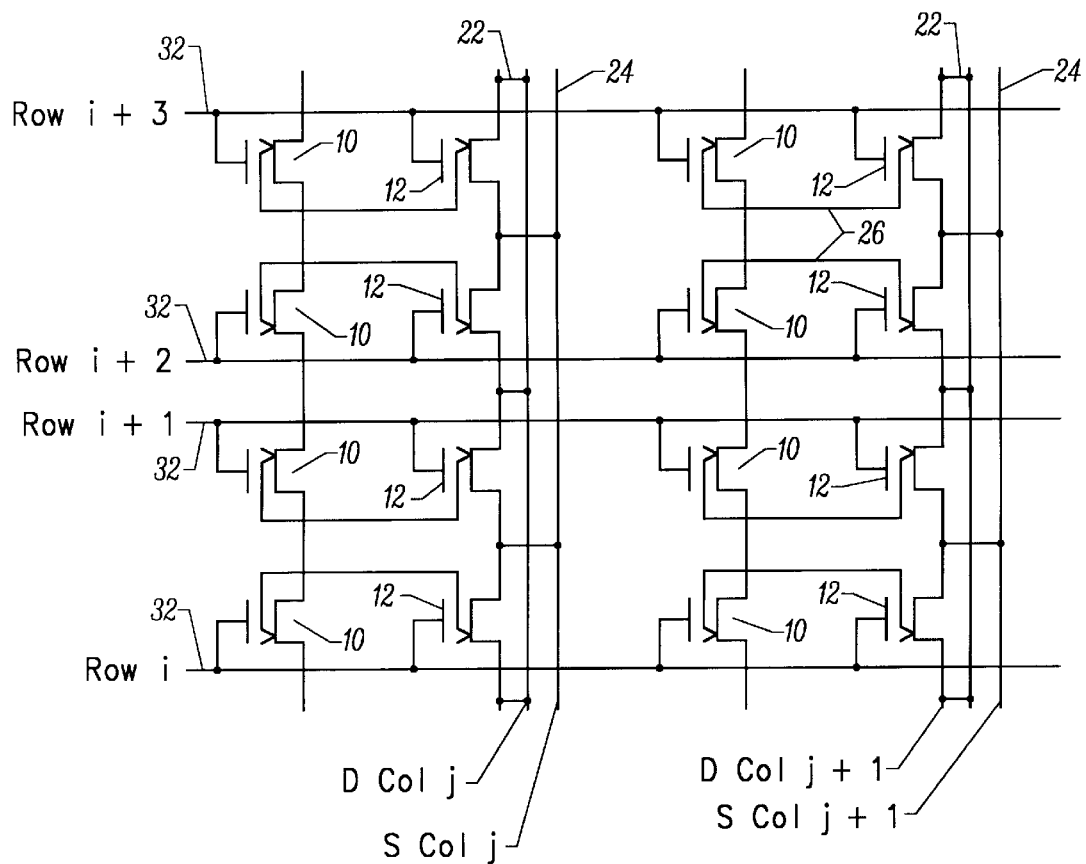
FIG. 4A is a schematic of a portion of an FPGA tile including two columns and four rows.
Figure 4B:
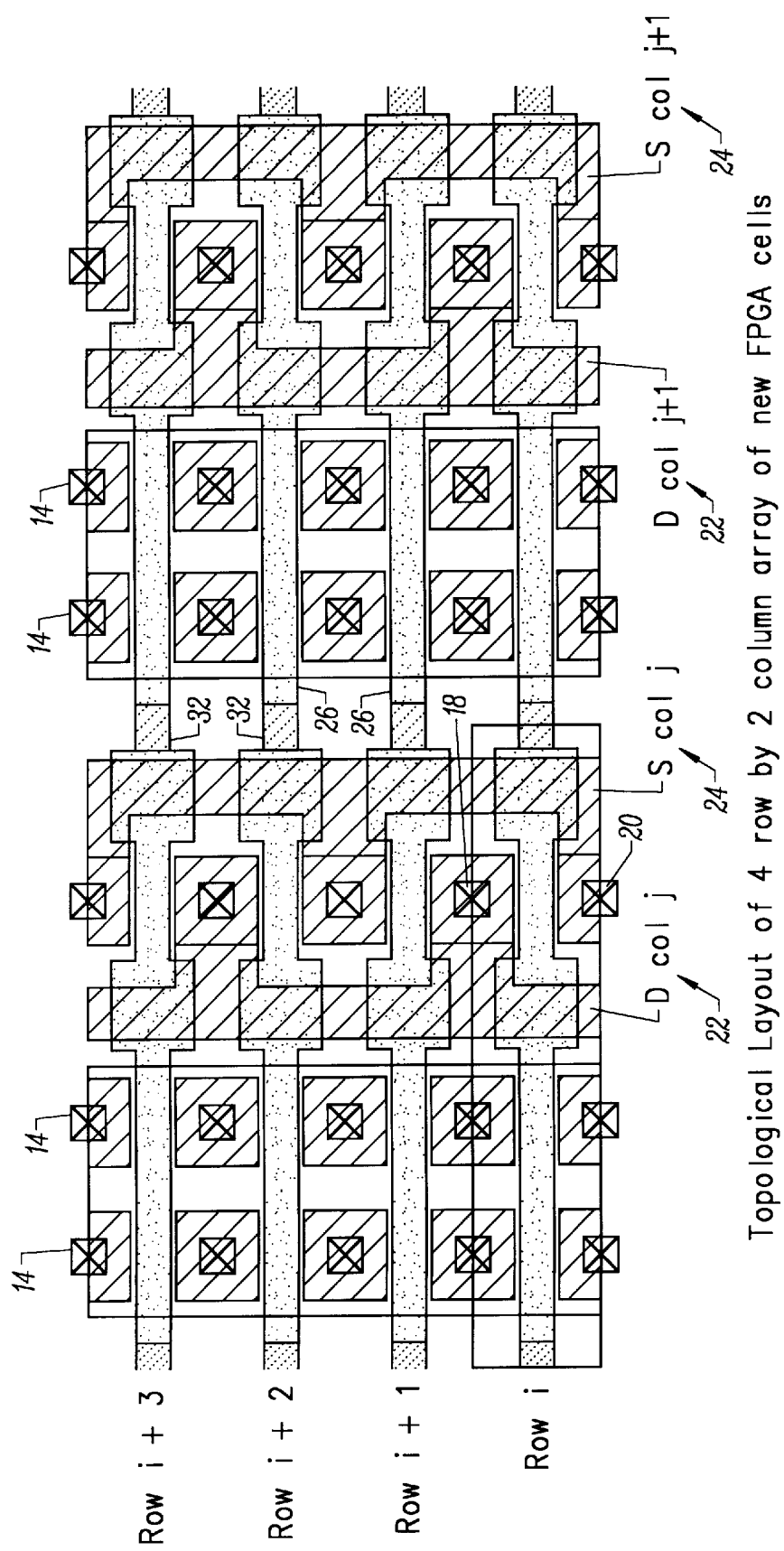
FIG. 4B is a plan view of the FPGA programmable interconnect cells of FIG. 4A.

An FPGA tile comprises an array of FPGA cells, for example, 32 rows by 5 columns for a core tile. FIGS. 4A and 4B are a schematic and a plan view of two columns and four rows in such an array. The reference numerals of FIGS. 1–3 are used in FIGS. 4A, 4B with all the poly 1 floating gates labeled 26, the poly 2 row lines labeled 32, the drain column lines labeled 22, and the source metal column lines labeled 24. The four rows are labeled row $_i$-row $_{i+3}$, the drain columns are labeled DCOL$_j$-DCOL$_{j+1}$, and the source columns are labeled SCOL$_j$ and SCOL$_{j+1}$. The measurement of programmed and erased sense transistor thresholds for each bit in the array of sense transistors is performed in the same manner that a NOR ROM is accessed. By biasing "off" each unselected bit sense transistor of the column and margining the selected bit. This measurement "margining" is done by varying the selected cell's control gate (row) voltage while detecting whether drain current is above or below some reference level. The row biases are driven by row drivers which have several modes of operation. They must supply high positive voltages with respect to the array during "erase", a block operation performed on all of the programmable interconnect cells simultaneously; they must supply a positive and negative voltages to the row during "program" and "read"; and they must supply a constant positive bias during "operating" mode. The column biases are applied by column drivers. To program, the columns must be driven as a pair to a positive voltage. One of the pair is forced to a low positive voltage level while sensing current during "read" while the other is held at ground. At all other times they are both grounded or open circuited.

Table 1 gives the approximate row and column and peak voltage levels for all operating modes. Program disturb is reduced to tolerable levels by overlapping row select/unselect window voltages with the column select/unselect window voltages by $V_{UUD}$. This voltage stresses the programmed bits whose rows and columns are both unselected, but reduces programming stress on erase bits where only the row or column, but not both, are unselected. These formulas are ideal examples, voltage levels may be adjusted to account for peripheral circuit breakdown voltages and row versus column programming time considerations.

TABLE 1

|  | Erase | Program | Read/Margin | Operate |
|---|---|---|---|---|
| Selected Row | Ramp to $V_{ERASE}$ | Ramp to $-V_p/(2*R_R)$ | $-V_R$ to $+V_R$ | OV to VCC |
| Selected Column Pair | Both = OV | Both Ramp to $+V_p/(2*(1-R_c))$ | Drain column □1v Source column = Ov | Both = OV |
| Unselected Row | Ramp to $V_{ERASE}$ | $V_{UUP}$ | $-(V_R + □)$ | — |
| Unselected Columns | Both = OV | OV | OV | — |

Figure 11:
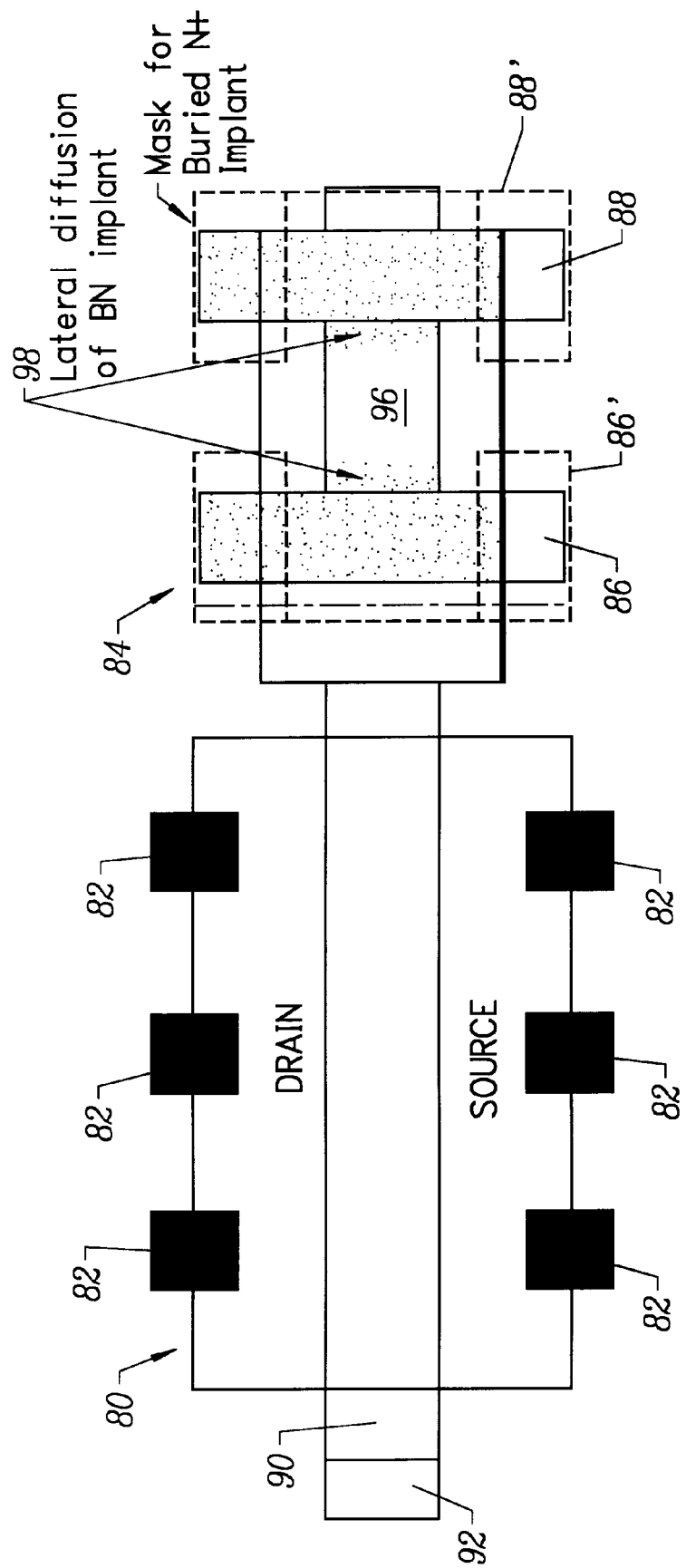
FIG. 11 is a plan view of a programmable interconnect cell, which is a improvement of the FIG. 1 type of programmable interconnect cell.

FIG. 11 illustrates an improvement of the previous programmable interconnect cell. The improved cell includes a switch transistor 80 which has source and drain regions with switch contacts 82, similar to the switch transistor in FIG. 1. A sense transistor 84 has a source region 86 and drain region 88 which are formed using a dopant implant mask for buried N+ implant for a P-doped substrate (2 e 15 at 15 Kev phosphorus) shown by dotted lines 86' and 88' for the source 46 and drain 88, respectively. The buried N+ source and drain are formed prior to formation of the polysilicon 1 floating gate 90 and the polysilicon 2 control gate 92 which run between the source and drain of switch transistor 80 and the source and drain of sense transistor 84. The subsequent polysilicon processing causes lateral dopant diffusion for drain 86 and source 88 into the channel region 96 between the source and drain, as shown at 98.

Figure 5A:
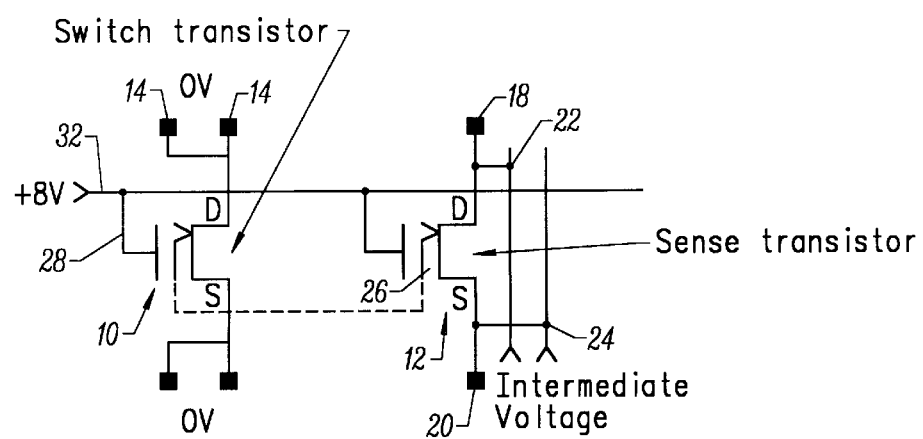
FIG. 5A is a circuit schematic of the FIG. 1 programmable interconnect cell with erase operation voltages.

The present invention is applicable to both previous and improved programmable interconnect cells. The present invention recognizes that in modem MOS process technology, the thickness of gate oxides of an MOS transistor is very thin. Specifically, the thickness' of gate oxides are well within the range for electron tunneling if sufficient voltages are applied across the oxides. Hence in the erase operation according to the present invention, the control gate voltage is raised to $V_{ERASE}$, approximately +18 volts, and the source and drain regions of the switch transistors are held at 0 volts. A bulk erase operation of all the switches is performed simultaneously. During the high voltage erase pulse, all the floating gates are charged up and because of this, all the switches are turned on. The power supply to FPGA cells is shut off. Since all switches in the routing architecture are turned on, all the source/drain contacts of the switch transistors are grounded. On the other hand, the source and drain regions of the sense transistors 12 are held at a voltage intermediate between 0 and +18 volts. Tunneling occurs through the gate oxide of the switch transistor 10. A circuit schematic with the various erase operation voltages is illustrated by FIG. 5A. The result of this erase operation is that more negative charge is placed on the floating gate, i.e., the floating gate voltage is more negative than if a conventional erase operation is performed.

Figure 5B:
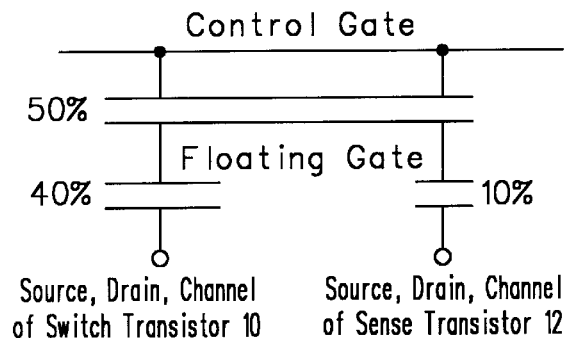
FIG. 5B is a circuit schematic illustrating the typical capacitive couplings in a FIG. 1 cell.

This result can be understood by considering the capacitive coupling between the control gate and the floating gate, between the floating gate and the source, drain and channel regions of the switch transistor, and between the floating gate and the source, drain and channel regions of the sense transistor, as illustrated schematically in FIG. 5B. For a typical programmable interconnect cell, there is a coupling ratio of about 50% between the control gate and the floating gate, 40% between the floating gate and the source, drain and channel regions of the switch transistor 10, and 10% between the floating gate and the source, drain and channel regions of the sense transistor 12. The oxide between the control and floating gates is typically two times thicker than the tunnel oxide, i.e., the oxide between the floating gate and the channel regions of the switch and sense transistors. With a high voltage on the control gate only, the floating gate voltage can be erased up to ⅓ of the control gate voltage, limited by the ratio of thickness' of the tunnel oxides. For +18 volts on the control gate, the floating gate is pulled up to +6 volts. After the erase operation and the control gate is dropped down to ground potential, the floating gate is -⅙ of the erase voltage previously on the control gate, i.e., -3 volts, due to the 50% coupling of the control gate with the floating gate.

With an intermediate voltage applied to the sense device during the erase operation, according to the present invention, the voltage in the sense transistor channel region is limited by the floating gate voltage minus the threshold voltage of the sense device, which is close to the floating gate voltage of ⅓ the control gate voltage. If the intermediate voltage goes above the floating gate voltage $-V_T$, or +6 volts for a +18 volt control gate voltage, the channel voltage is capped and only the source/drain overlap capacitance is still effective (perhaps 3%, instead of 10%). The floating gate voltage can still be erased up to ⅓ the control gate voltage limited by the ratio of the oxide thickness'. The advantage of the present invention occurs by dropping the control gate voltage, as well as the voltage on the source and drains of the sense device, toward ground. Starting from the same floating gate voltage, switching down, for example, an additional column, i.e., source/drain, voltage of about 6 volts with a coupling to the floating gate of 10% results in an additional -0.6 volts to the negative floating gate voltage. For example, with the exemplary erase voltage of +18 volts, the floating gate voltage is -3.6 volts, rather than -3 volts under a conventional erase operation. The invention is equivalent to raising the control gate erase voltage up to +21.6 volts with a conventional erase operation.

It should be noted that voltages noted here are process-dependent and the absolute values of the voltages will shrink as further developments in semiconductor technology shrink the sizes of the semiconductor devices even further. A general relationship, though, is that the control gate voltage in the erase operation is approximately between the sum of the FN tunnel threshold voltages and the sum of the FN voltages at the critical field of the tunnel oxide and the oxide between the floating gate and the control gate; and the intermediate voltage on the source/drains of the sense device is between the ground and two times the FN voltage at the critical field of the tunnel oxide.

Thus the present invention allows the erase voltage on the control gate to be lowered, which lessens the requirements of the programming circuits, or the time for the erase operation to be shortened. The erase pulse times are typically in the order of seconds and is a significant factor in test costs. The present invention significantly reduces the required erase times and lowers the test costs. In either case, the stress caused by the erase operation is lessened. Alternatively, the present invention may be used to increase the negative voltage on the floating gate voltage of the erased cell to shift the operating window towards higher voltages for the programmed cells by biasing the control gate and sense device to higher voltages.

Figure 6:
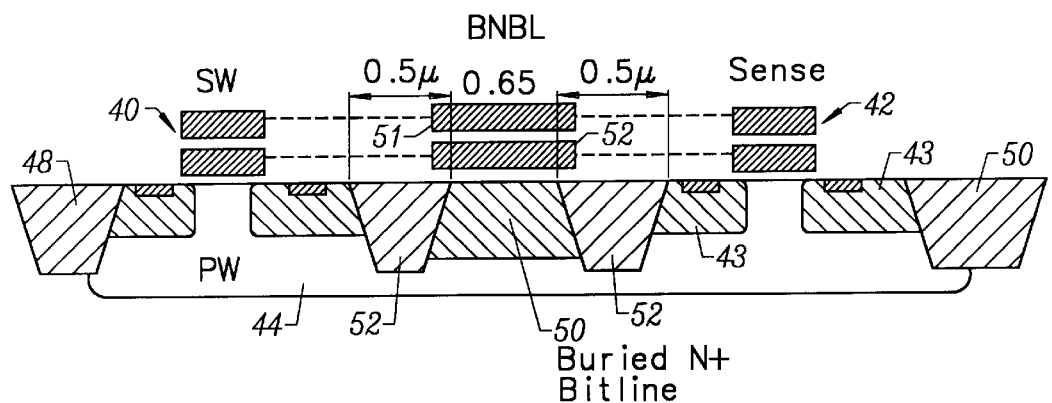
FIG. 6 is a cross-sectional view of another type of programmable interconnect cell in which the present invention may be applied.

The present invention works equally as well, if not better, on the second type of programmable interconnects. These programmable interconnects have a Fowler-Nordheim tunneling device for erase and program operations, in addition to the switch and sense transistors. The above-mentioned U.S. application. Ser. No. 09/205,876 describes examples of such programmable interconnects, such as illustrated in FIG. 6. The cross-sectional view of a programmable interconnect cell illustrated in a cross-sectional view has N channel transistors formed in P doped wells. Of course, it should be understood that the cell structures can be P channel transistors formed in N doped wells. The programmable interconnect cell includes a switch transistor 40 and a sense transistor 42 fabricated in P well 44. The source/drains 41 of the switch transistor 40 are formed in abutment with field oxide 48 and oxide isolation 62, and the source/drain regions 43 of the sense transistor 42 are formed in abutment with field oxide 50 and a second oxide isolation 62. The switch transistor 40 and sense transistor 42 share a common floating gate 52 and control gate 54. A buried N+ bitline 60 is formed in the P doped well 44 in juxtaposition with the switch transistor 40 and sense transistor 42 with the polysilicon floating gate 42 and polysilicon floating gate 44 extending over the buried N+ bitline 60. The bitline 60 is formed between the two oxide isolation regions 62 to provide electrical isolation of the buried bitline from the switch transistor 40 and sense transistor 42. Programming of the floating gate is effected from the conductive region of the buried N+ bitline, and the sense transistor 42 functions only for determining the programming of the cell. Accordingly, the transistors 40 and 42 can be formed in the same fabrication process steps with identical dopant concentrations and cell structures.

Figure 7:
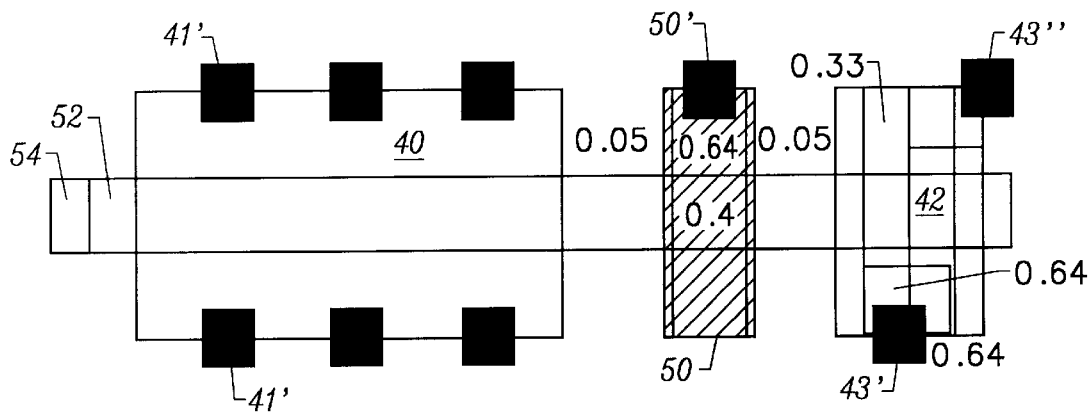
FIG. 7 is a plan view of the cell structure of FIG. 6.

FIG. 7 is a plan view of the cell of FIG. 6 further illustrating the layout of the switch transistor 40, the sense transistor 42, and the buried N+ bitline 60. The polysilicon 1 floating gate 52 extends the length of the cell but is restricted thereto, whereas the self-aligned polysilicon 2 control gate 54 extends to adjacent cell structures. Contacts 41', which form the circuit nodes of the user-configurable circuit of the FPGA, are provided to the source/drain regions 41 of the switch transistor 40 for contacting circuit nodes, contacts 43', 43" are made to the source and drain regions 43 of switch transistor 42, and contact 60' is made to the buried N+ bitline 60.

Figure 8:
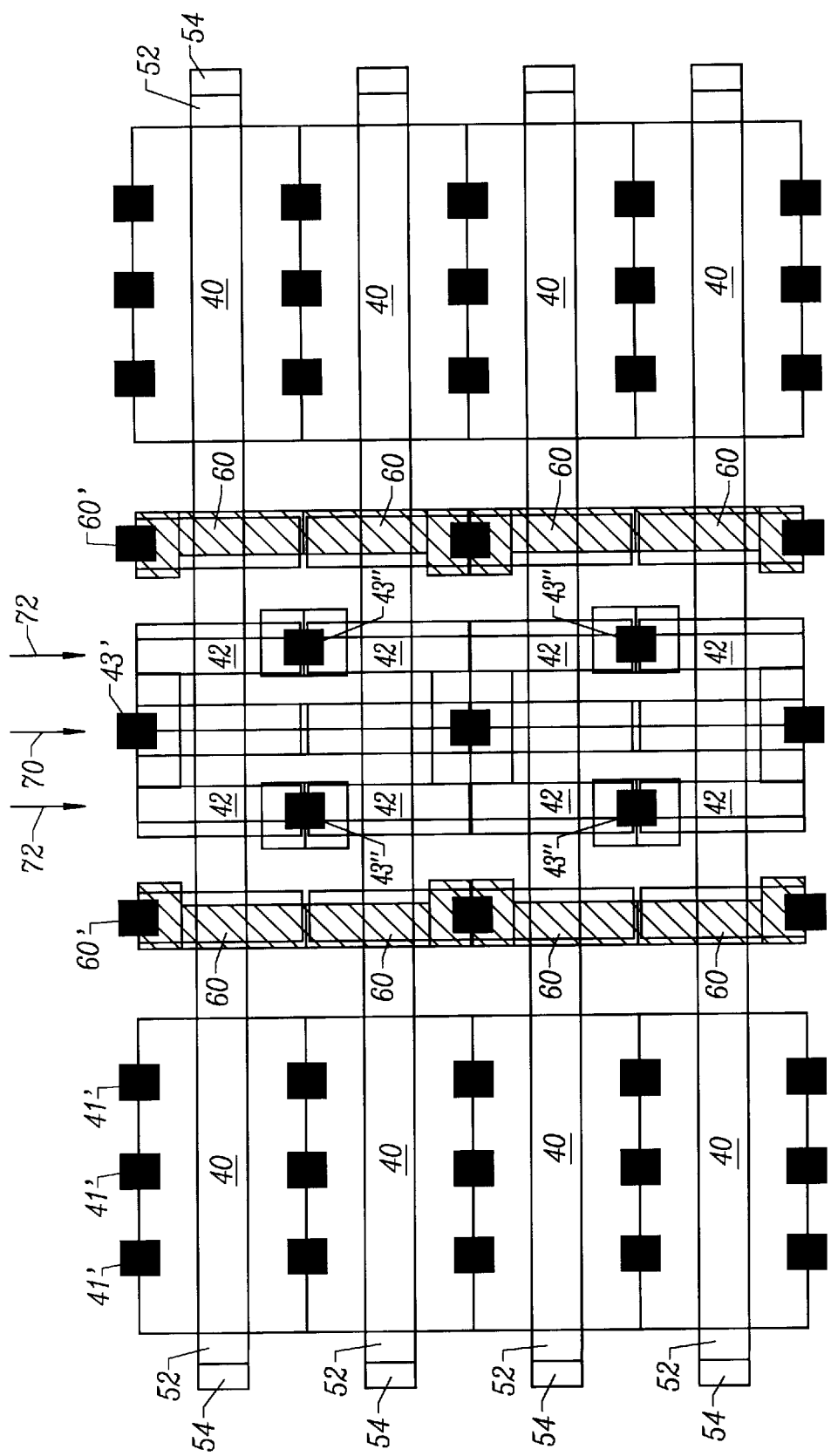
FIG. 8 is a plan view of an array of cells illustrated in FIG. 7.

FIG. 8 is a plan view of an array of cell structures as illustrated in FIG. 7, and again like elements have the same reference numerals. The cells are laid out laterally with the polysilicon control gate 54 extending laterally across all cells. The bitlines 60 run vertically between the switch transistors 40 and sense transistors 42 in each cell in a column. A ground line 70 runs vertically and engages the contacts 43', to the source regions of the sense transistors in the stacked adjacent sense transistors. Sense lines 72 run parallel to the ground line 70 and engage the drain regions of sense transistors in adjacent and stacked cells. The ground and sense lines are metal lines overlying and insulated from the cell structures. In this embodiment, sources in adjacent columns have a shared grounded source line.

Figure 9:
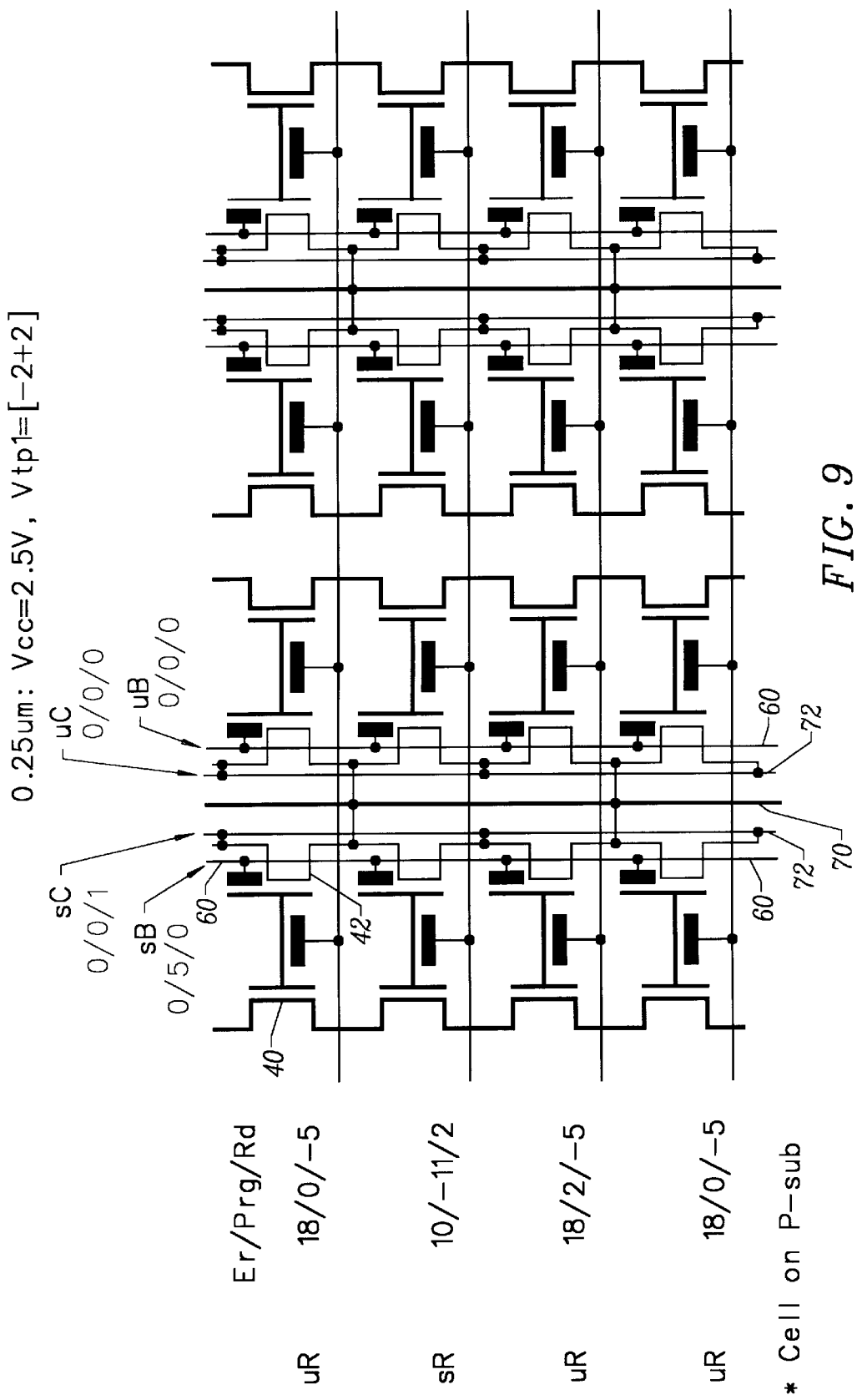
FIG. 9 is an electrical schematic of the array of cells in FIG. 8.

FIG. 9 is an electrical schematic of the array of FIG. 7 and illustrates the respective control gate voltages for erase/program/read (Er/Prg/Rd) for unselected Rows (uR) and for selected Rows (sR) respectively. The voltages are for a cell structure having 0.25 micron gate width, Vcc of 2.5 volts and $v_{tp}$=[−2 volt, +2 volt].

For erasing the programmable interconnect cells of a block conventionally, the control gates are raised to +18 volts while the bitlines (sB) and the column (sC) of the block are grounded. For a programming operation in which electrons are removed from the floating gate of a selected cell, −11 volts is applied to the control gate for the selected Row (sR) while all other control gates (uR) are grounded or raised to a positive voltage (e.g. 0 to +5 volts) to prevent Bitline disturb. The bitline for the column to be programmed (sB) is raised to +5 volts while the selected column (sB) is grounded whereby electrons flow from the floating gate to the bitline. All other bitlines (uB), column lines (uC) and rows (uR) are grounded.

During a read operation the control gate for the row (sR) to be sensed is biased to +2 volts while all other control gates (uR) are biased to −5 volts. All bitlines are grounded, and the drain line for unselected columns of cells is grounded while the drain for the selected column is biased to +1 volt. Thus with a voltage bias of 1 volt across a source and drain of the sense transistor and a control gate voltage of +2 volts, current will flow through a programmed cell while no current flows through an erased cell.

Figure 10A:
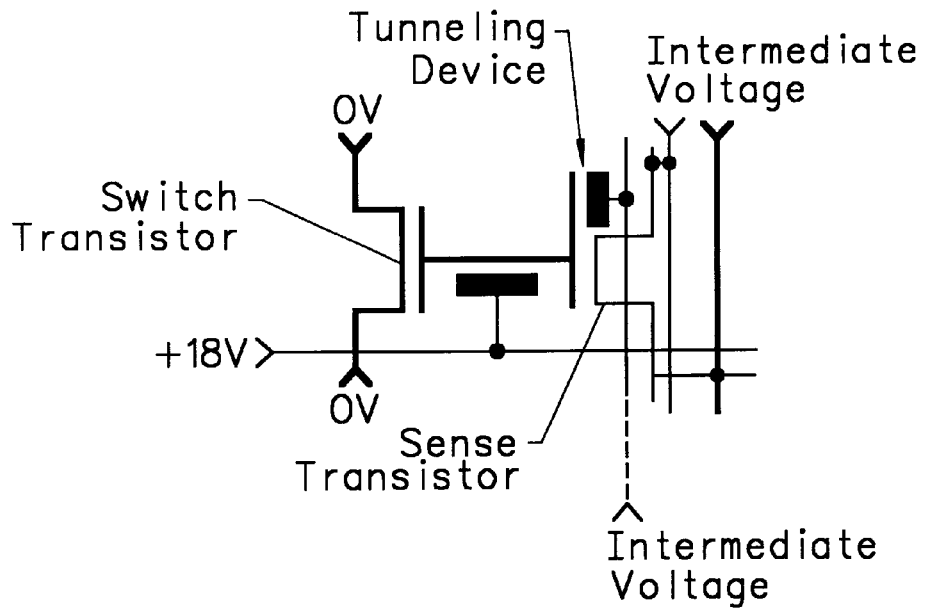
FIG. 10A is a circuit schematic of the FIGS. 6 and 7 programmable interconnect cell with erase operation voltages.
Figure 10B:
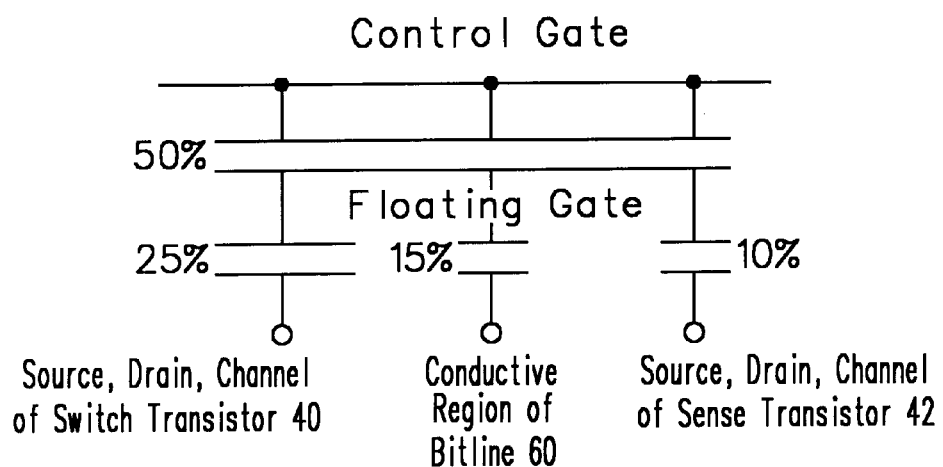
FIG. 10B is a circuit schematic illustrating the typical capacitive couplings in a FIGS. 6 and 7 cell.

In accordance with the present invention, the control gates of the block to be erased is raised to +18 volts, for the erase operation. Voltages on the source/drain regions of the switch transistors 40 are grounded, i.e., 0 volts, and the voltages on the bit lines 60 and on the source/drain regions of the sense transistors 42 are biased to voltages intermediate +18 and 0 volts. A circuit schematic of a programmable interconnect cell with the erase operation voltages is shown in FIG. 10A. The intermediate voltages may not necessarily be the same. The described programmable interconnect cell has a typical coupling ratio of 50% between the control gate and the floating gate, 25% between floating gate and the source, drain and channel regions of the switch transistor 40, 15% between the floating gate and the buried N+ bit line 60 region, and 10% between the floating gate and the source, drain and channel regions of the sense transistor 42. FIG. 10A illustrates these relationships for a programmable interconnect cell. The sense channel voltage is limited to the floating gate voltage also, but the buried N+ voltage may be raised even more; theoretically up to 2/3 of the erase voltage, but in practice typically up to 1/2 of the erase voltage limited by the junction breakdown. With present process technologies, intermediate voltages in the range of 7 to 9 volts work quite well. After the erase operation and all the terminals are brought to ground potential, the floating gate voltage of the erased cell ends up at −4.95 volts, which corresponds to an erase voltage of +29.7 volts for an erase operation performed conventionally. Hence this type of programmed interconnect cell also benefits from an erase operation according to the present invention.

While the description above provides a full and complete disclosure of the preferred embodiments of the present invention, various modifications, alternate constructions, and equivalents will be obvious to those with skill in the art. Thus, the scope of the present invention is limited solely by the metes and bounds of the appended claims.

What is claimed is:

1. In an integrated circuit having a plurality of programmable interconnect cells, each cell selectively interconnecting first and second circuit nodes, each cell having a first transistor having a floating gate, a control gate, and first and second source/drain regions connected respectively to said first and second circuit nodes, and a second transistor having a floating gate connected to said floating gate of said first transistor, a control gate connected to said control gate of said first transistor, and first and second source/drain regions, a method of erasing said programmable interconnect cells comprising asserting a first voltage of a first polarity on said control gates of said first and second transistors;

asserting a ground voltage on said first and second source/drain regions of said first transistor; and asserting a second voltage intermediate said first voltage and said ground voltage on said first and second source/drain regions of said second transistor.

2. The method of claim 1 wherein each of said programmable interconnect cells further has a tunneling device having a floating gate connected to said floating gates of said first and second transistors, a control gate connected to said control gates of said first and second transistors, and a conductive region below said floating and said control gate, said method further comprising asserting a third voltage intermediate said first voltage and said ground voltage on said conductive region of said tunneling device.

3. The method of claim 2 wherein said third voltage is equal to said second voltage.

4. The method of claim 2 wherein said first voltage is approximately +18 volts and said second and third voltages are in the range of 0 to +12 volts.

5. The method of claim 1 wherein said first voltage is approximately +18 volts and said second voltage is in the range of 0 to +12 volts.

* * * * *